(12) United States Patent
Inouchi et al.

(10) Patent No.: US 8,147,705 B2
(45) Date of Patent: Apr. 3, 2012

(54) METHOD OF OPERATING ION SOURCE AND ION IMPLANTING APPARATUS

(75) Inventors: Yutaka Inouchi, Kyoto (JP); Syojiro Dohi, Kyoto (JP); Yasunori Ando, Kyoto (JP); Yasuhiro Matsuda, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 1131 days.

(21) Appl. No.: 11/583,040

(22) Filed: Oct. 19, 2006

(65) Prior Publication Data
US 2007/0089833 A1 Apr. 26, 2007

(30) Foreign Application Priority Data
Oct. 20, 2005 (JP) .................. 2005-305365

(51) Int. Cl.
C23F 1/00 (2006.01)
H01J 37/08 (2006.01)
(52) U.S. Cl. .......................... 216/59; 216/66
(58) Field of Classification Search .......... None
See application file for complete search history.

(56) References Cited

U.S. PATENT DOCUMENTS

| | | | | |
|---|---|---|---|---|
| 5,449,920 A | * | 9/1995 | Chan | 250/492.21 |
| 5,517,084 A | * | 5/1996 | Leung | 315/111.81 |
| 6,060,836 A | * | 5/2000 | Maeno et al. | 315/111.21 |
| 6,525,482 B2 | * | 2/2003 | Miyamoto | 315/111.81 |
| 2002/0029746 A1 | * | 3/2002 | Yamashita | 118/723 FI |
| 2005/0061997 A1 | * | 3/2005 | Benveniste | 250/492.21 |
| 2008/0248636 A1 | * | 10/2008 | Olander et al. | 438/515 |
| 2009/0250340 A1 | * | 10/2009 | Sasaki et al. | 204/298.02 |

FOREIGN PATENT DOCUMENTS

| | | | |
|---|---|---|---|
| JP | 64-35843 | | 2/1989 |
| JP | 06176725 A | * | 6/1994 |
| JP | 8-241687 | | 9/1996 |
| JP | 8-306334 | | 11/1996 |
| JP | 11-329270 | | 11/1999 |
| JP | 11329270 A | * | 11/1999 |
| JP | 2004-362901 | | 12/2004 |

OTHER PUBLICATIONS

Office Action dated Nov. 26, 2007; Patent Application No. 2005-305365; 3 pages.

* cited by examiner

*Primary Examiner* — Anita Alanko
(74) *Attorney, Agent, or Firm* — Finnegan, Henderson, Farabow, Garrett & Dunner, L.L.P.

(57) ABSTRACT

When an ion beam 4 is to be extracted from an ion source 2 by using a gas containing boron trifluoride as an ion source gas 50 for supplying the gas into a plasma chamber 20 for the ion source 2, a bias voltage $V_B$ of a plasma electrode 31 with respect to the plasma chamber 20 for the ion source 2 is set to be positive by a bias circuit 64.

2 Claims, 5 Drawing Sheets

METHOD OF OPERATING ION SOURCE AND ION IMPLANTING APPARATUS

TECHNICAL FIELD

The present disclosure relates to a method of operating an ion source which is used in, for example, an ion implanting apparatus (in the specification, including an apparatus which is called an ion doping apparatus), and an ion implanting apparatus in which the operating method can be executed. In the specification, the term of an ion means a positive ion, and the term of an ion beam means a positive ion beam.

RELATED ART

As an ion source from which an ion beam is extracted, known is an electron impact type ion source in which an ion source gas in a plasma chamber is ionized by means of electron impact due to arc discharge or the like, thereby producing a plasma.

As an electron impact type ion source, there is an ion source which forms a cusp magnetic field (multi-pole magnetic field) in the vicinity of an inner wall of a plasma chamber. Such an ion source is also called a bucket type ion source, a multi-pole magnetic field type ion source, or a multi-cusp type ion source.

In such an ion source, the potential of a plasma electrode with respect to the plasma chamber will be considered. The plasma electrode is an electrode which is closest to the plasma in the plasma chamber among extraction electrodes constituting an extraction electrode system that extracts an ion beam from the plasma. Conventionally, the plasma electrode is electrically insulated from the plasma chamber by an insulator, and the potential of the plasma electrode with respect to the plasma chamber is biased to a negative voltage by a DC power source, or set to a floating potential while connecting the plasma chamber and the plasma electrode through a high resistance. In the case of a floating potential, the potential of the plasma electrode in the ion beam extraction is set to be negative by a self-bias due to incidence of many electrons, a because electrons are lighter than ions in a plasma and hence their mobility is very higher.

In any case, therefore, the bias voltage of the plasma electrode with respect to the plasma chamber in the ion beam extraction is usually set to be negative. This is caused mainly by the following reason. When the bias voltage is set to be negative, electrons in a plasma hardly escape toward the plasma electrode of the same polarity, thereby reducing loss of electrons, and ions in the plasma are efficiently extracted through a plasma electrode of the opposite polarity.

As an example of a configuration corresponding to the technique of setting the bias voltage to be negative, Patent Reference 1 (Japanese Patent Unexamined Publication No. 2004-362901 (Paragraph 0041, FIG. 1)) shows a figure showing a configuration where a negative electrode of a power source for extraction is connected to a first extraction electrode (corresponding to a plasma electrode) (see FIG. 1).

SUMMARY

Experiments showed the followings. In the above-described related-art method of applying a bias voltage, or in other words a method of operating an ion source, when an ion beam is extracted by using a gas containing phosphine ($PH_3$) (for example, a gas which is obtained by diluting phosphine with hydrogen or helium) as an ion source gas, a ratio of desired ions, specifically $PH_3^+$ (x=0 to 3, $P^+$ in case of x=0, and the same will apply hereinafter) to other ions (e.g., $H^+$, $H_2^+$, and $H_3^+$) can be increased. By contrast, when an ion beam is extracted by using a gas containing boron trifluoride ($BF_3$) (for example, boron trifluoride of a concentration of 100%) as an ion source gas, it is difficult to increase a ratio of desired ions, specifically $B^+$ to other ions (e.g., $F^+$, $BF^+$, and $BF_2^+$).

Embodiments of the present invention provide a method of operating an ion source, and an ion implanting apparatus in which, when an ion beam is extracted by using a gas containing boron trifluoride as an ion source gas, the ratio of $B^+$ in the ion beam can be increased.

Further, embodiments of the present invention provide a method of operating an ion source, and an ion implanting apparatus in which, when an ion beam is extracted by switchingly using a gas containing boron trifluoride and that containing phosphine, the ratio of $B^+$ in the ion beam can be increased in the case where the former gas is used, and the ratio of $PH_x^+$ can be increased in the case where the latter gas is used.

A first method of operating an ion source according to the invention is a method of operating an ion source comprising: a plasma chamber into which an ion source gas is introduced, and which is used for internally producing a plasma; an ionizing member for ionizing the ion source gas in the plasma chamber by means of electron impact to produce a plasma; an extraction electrode system which is disposed in a vicinity of an opening portion of the plasma chamber, which extracts an ion beam from the plasma, and which has one or more electrodes; an insulating member for electrically insulating a plasma electrode from the plasma chamber, the plasma electrode being an electrode which is closest to the plasma among the electrodes constituting the extraction electrode system; and a plurality of magnets which form a cusp magnetic field in a vicinity of an inner wall of the plasma chamber, wherein, when the ion beam is to be extracted by using a gas containing boron trifluoride ($BF_3$) as the ion source gas, a bias voltage of the plasma electrode with respect to the plasma chamber is set to be positive.

According to the first operating method, it has been checked by experiments that, when the bias voltage is set to be positive, the ratio of $B^+$ in the ion beam can be increased as compared with the case where the bias voltage is negative or 0 V.

A second method of operating an ion source according to the invention is a method in which, when the ion beam is to be extracted by using a gas containing boron trifluoride ($BF_3$) as the ion source gas, a bias voltage of the plasma electrode with respect to the plasma chamber is set to be positive, and, when the ion beam is to be extracted by using a gas containing phosphine ($PH_3$) as the ion source gas, the bias voltage of the plasma electrode with respect to the plasma chamber is set to be negative.

According to the second operating method, it has been checked by experiments that, when the bias voltage is switched as described above, the ratio of $B^+$ in the ion beam can be increased in the case where the gas containing boron trifluoride is used as the ion source gas, and the ratio of $PH_x^+$ in the ion beam can be increased in the case where the gas containing phosphine is used.

A first ion implanting apparatus according to the invention is an apparatus having a configuration in which ion implantation is performed by causing an ion beam extracted from an ion source to be incident on a substrate, and comprising: (a) an ion source having: a plasma chamber into which an ion source gas is introduced, and which is used for internally producing a plasma; an ionizing member for ionizing the ion source gas in the plasma chamber by means of electron impact to produce a plasma; an extraction electrode system which is disposed in a vicinity of an opening portion of the plasma chamber, which extracts an ion beam from the plasma, and which has one or more electrodes; an insulating member for electrically insulating a plasma electrode from the plasma chamber, the plasma electrode being an electrode which is closest to the plasma among the electrodes constituting the extraction electrode system; and a plurality of magnets which form a cusp magnetic field in a vicinity of an inner wall of the plasma chamber; (b) a gas supplying unit for supplying an ion source gas containing boron trifluoride ($BF_3$) into the plasma chamber of the ion source; and (c) a biasing unit in which, when the ion beam is to be extracted by using a gas containing boron trifluoride as the ion source gas, a bias voltage of the plasma electrode with respect to the plasma chamber is set to be positive.

According to the first ion implanting apparatus, an ion beam including boron-containing ions can be extracted from the ion source by using the ion source gas containing boron trifluoride, and the bias voltage can be set to be positive so that the ratio of $B^+$ in the ion beam can be increased.

A second ion implanting apparatus according to the invention is an apparatus comprising: (a) an ion source which is configured in the same manner as the ion source of the first ion implanting apparatus; (b) a gas supplying unit for switchingly supplying an ion source gas containing boron trifluoride ($BF_3$), and an ion source gas containing phosphine ($PH_3$) into the plasma chamber of the ion source; (c) a biasing unit in which, when the ion beam is to be extracted from the ion source, a bias voltage of the plasma electrode with respect to the plasma chamber is switchable between a positive voltage and a negative voltage; and (d) a controller for controlling the gas supplying unit and the biasing unit to, when the ion source gas containing boron trifluoride is to be supplied into the plasma chamber, set the bias voltage to be positive, and, when the ion source gas containing phosphine is to be supplied into the plasma chamber, set the bias voltage to be negative.

According to the second ion implanting apparatus, while switching the ion source gas between a gas containing boron trifluoride and that containing phosphine, an ion beam including boron-containing ions and that including phosphorus-containing ions can be switchingly extracted from one ion source, and the bias voltage is switched as described above so that the ratio of $B^+$ in the ion beam can be increased in the case where the ion source gas containing boron trifluoride is used, and the ratio of $PH_x^+$ in the ion beam can be increased in the case where the ion source gas containing phosphine is used.

A third ion implanting apparatus according to the invention may further comprise a mass separating unit for performing mass separation on the ion beam which is extracted from the ion source, between the ion source and a holding portion for the substrate, in addition to the structure of the first and second ion implanting apparatuses.

According to the first method of the invention, in the case where the bias voltage is set to be positive when the ion beam is to be extracted by using a gas containing boron trifluoride as the ion source gas, the ratio of $B^+$ in the ion beam can be increased as compared with the case where the bias voltage is negative or 0 V. Namely, it is possible to efficiently extract $B^+$.

Consequently, the following effects can be attained. When $B^+$ is used as desired ions, it is possible to reduce the ratio in which undesired ions other than the desired ones are accelerated. Therefore, the capacity of an acceleration power source for accelerating the ion beam can be reduced. In the case where a mass separating unit is disposed on the downstream side of the ion source, it is possible to reduce problems of an out-gas which is generated by impinging of the undesired ions against a wall face or the like in the mass separating unit, and metal contamination (contamination of a substrate by a metal substance, the same will apply hereinafter).

According to the second method of the invention, when the bias voltage is switched as described above, the ratio of $B^+$ in the ion beam can be increased and $B^+$ can be efficiently extracted in the case where a gas containing boron trifluoride is used as the ion source gas, and the ratio of $PH_x^+$ in the ion beam can be increased and $PH_x^+$ can be efficiently extracted in the case where a gas containing phosphine is used.

Consequently, the following effects can be attained. In the case where $B^+$ and $PH_x^+$ are switchingly used as desired ions, in both the ion kinds, the capacity of an acceleration power source can be reduced in the same manner as the invention of the first method. Furthermore, the problems of an out-gas and metal contamination in the case where a mass separating unit is disposed can be reduced.

According to the first apparatus of the invention, an ion beam including boron-containing ions can be extracted from the ion source by using an ion source gas containing boron trifluoride, and the bias voltage can be set to be positive so that the ratio of $B^+$ in the ion beam can be increased. Namely, it is possible to efficiently extract $B^+$.

Consequently, the following effects can be attained. When $B^+$ is used as dopant ions for ion implantation on a substrate, it is possible to reduce the ratio in which undesired ions other than the dopant ions are accelerated. Therefore, the capacity of an acceleration power source for accelerating the ion beam can be reduced. In the case where a mass separating unit is disposed between the ion source and a holding portion for the substrate, it is possible to reduce the problems of an out-gas which is generated by impinging of the undesired ions against a wall face or the like in the mass separating unit, and metal contamination.

According to the second apparatus of the invention, while switching the ion source gas between a gas containing boron trifluoride and that containing phosphine, an ion beam including boron-containing ions and that including phosphorus-containing ions can be switchingly extracted from one ion source, and the bias voltage is switched as described above so that the ratio of $B^+$ in the ion beam can be increased and $B^+$ can be efficiently extracted in the case where an ion source gas containing boron trifluoride is used, and the ratio of $PH_x^+$ in the ion beam can be increased and $PH_x^+$ can be efficiently extracted in the case where an ion source gas containing phosphine is used.

Consequently, the following effects can be attained. In the case where $B^+$ and $PH_x^+$ are switchingly used as dopant ions for ion implantation on a substrate, in both the ion kinds, the capacity of an acceleration power source can be reduced in the same manner as the invention of the first apparatus. Furthermore, the problems of an out-gas and metal contamination in the case where a mass separating unit is disposed can be reduced.

According to the third apparatus of the invention, the mass separating unit is disposed between the ion source and the holding portion for the substrate. Therefore, undesired ions other than dopant ions can be suppressed from being implanted into the substrate. As described above, furthermore, it is possible to reduce the problems of an out-gas which is generated by impinging of undesired ions in the mass separating unit against a wall face or the like, and metal contamination.

DETAILED DESCRIPTION

Figure 1:
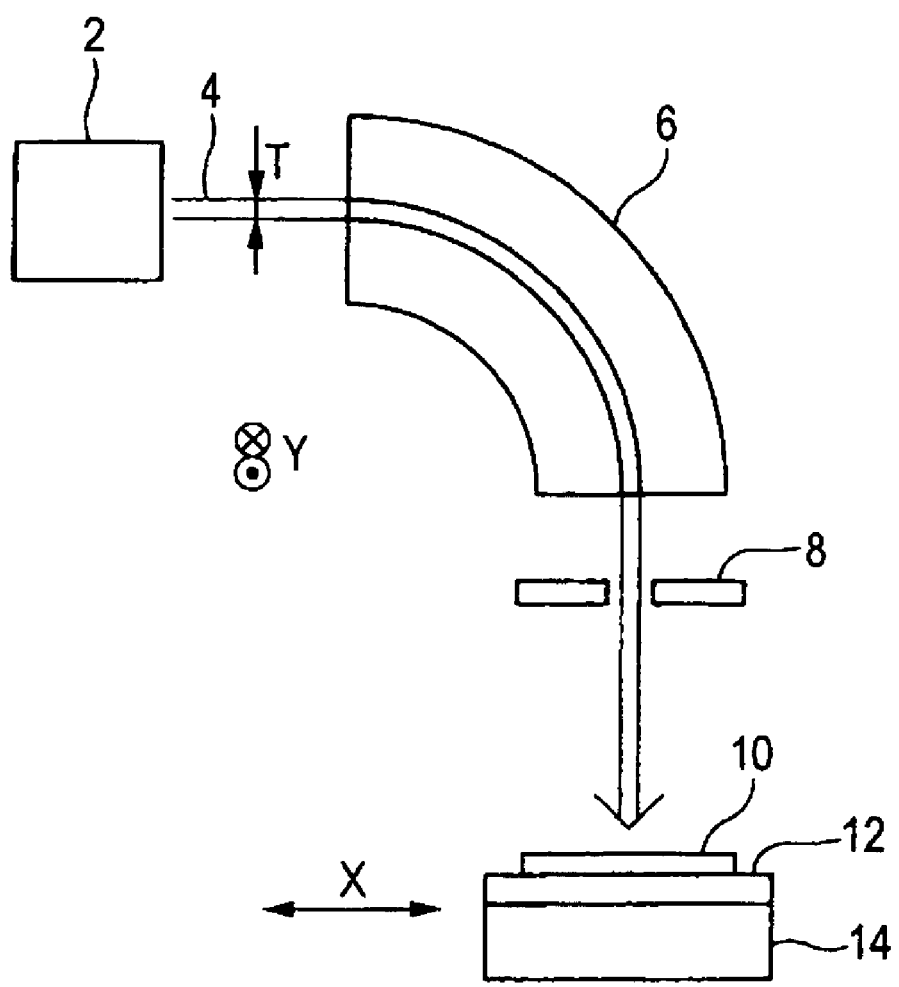
FIG. 1 is a schematic plan view showing an embodiment of the ion implanting apparatus of the invention.

FIG. 1 is a schematic plan view showing an embodiment of the ion implanting apparatus of the invention. The ion implanting apparatus is configured so that an ion beam 4 extracted from an ion source 2 is incident on a substrate 10 held by a holding portion 12 of a substrate driving device 14, to perform ion implantation on the substrate 10. The path (beam line) of the ion beam 4 from the ion source 2 to the substrate driving device 14 is surrounded by a vacuum vessel (not shown), and maintained to a vacuum atmosphere during ion implantation.

In the embodiment, the ion beam 4 which is extracted from the ion source 2 and incident on the substrate 10 has a sheet-like shape in which the width W (see FIG. 2) in the Y direction that coincides with the front and rear directions of the sheet face of FIG. 1 is sufficiently larger than the thickness T in the direction perpendicular to the Y direction. The width W of the ion beam 4 when the beam is incident on the substrate is slightly larger than the dimension of the substrate 10 in the same direction.

In the embodiment, a mass separating magnet 6 and a separation slit 8 which constitute a mass separating unit for performing mass separation on the ion beam 4 extracted from the ion source 2 are disposed between the ion source 2 and the holding portion 12. The mass separating magnet 6 bends the ion beam 4 in the direction of the thickness T to selectively extract desired ions. The separation slit 8 is disposed on the downstream side of the mass separating magnet 6, and cooperates with the mass separating magnet 6 to selectively allow the desired ions to pass therethrough.

In the embodiment, the substrate driving device 14 mechanically drives in a reciprocal manner the substrate 10 held on the holding portion 12 in the X direction extending along the direction of the thickness T (in other words, the direction intersecting with the width W) of the ion beam 4 that is incident on the substrate 10. In the embodiment, the substrate driving device 14 itself reciprocates in the X direction along a rail (not shown). Because of the reciprocal driving of the substrate 10 and the sheet-like shape of the ion beam 4, ion implantation can be performed while the ion beam 4 is incident on the whole face of the substrate 10.

For example, the ion implantation can be used in a step of forming many thin film transistors (TFTs) on the surface of the substrate (glass substrate) 10 for a flat panel display (FPD). Sometimes, the ion implantation in this case is called ion doping, and the ion implanting apparatus is called an ion doping apparatus. The substrate 10 may be a substrate other than the above-described one, or for example may be a semiconductor substrate or the like.

Figure 2:
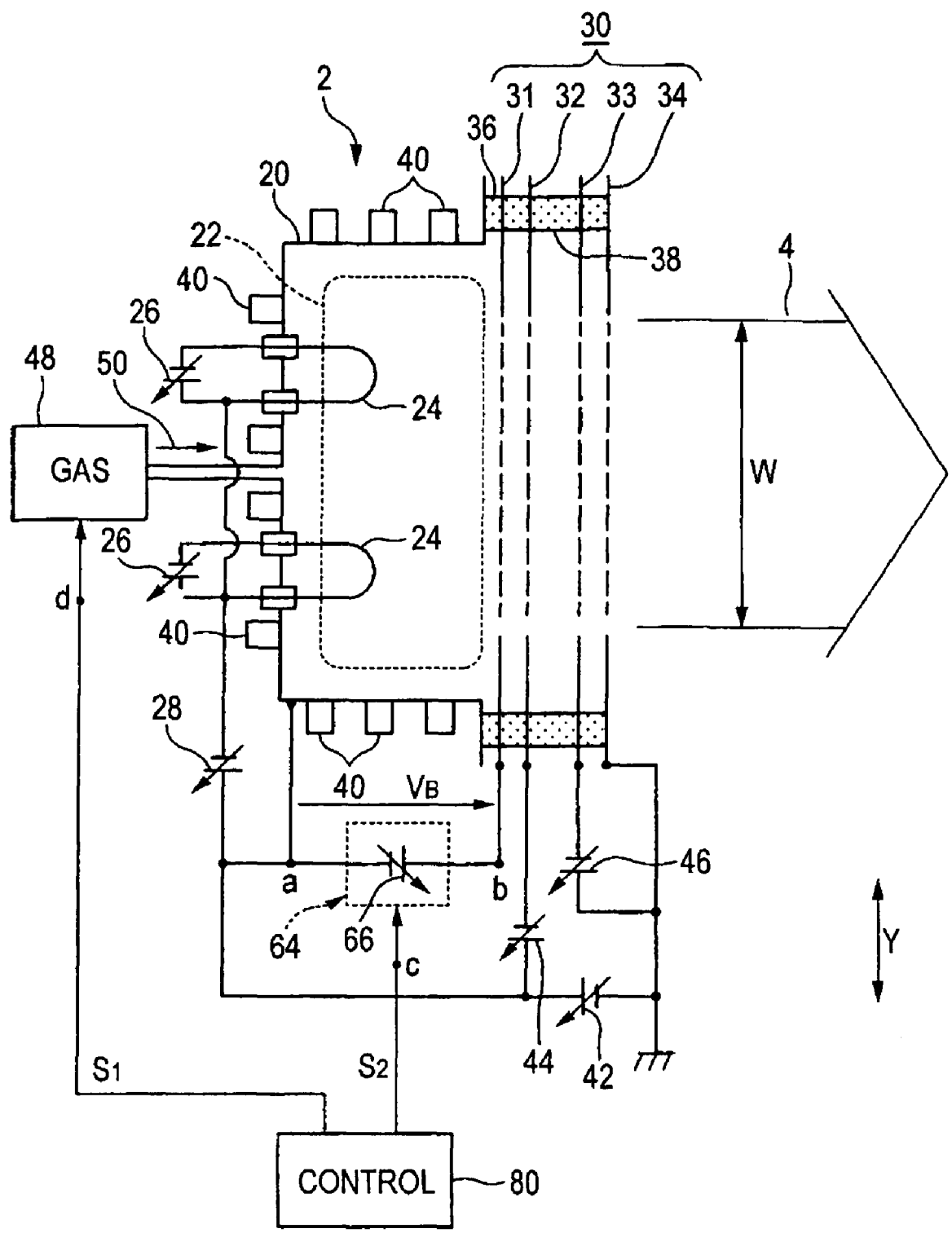
FIG. 2 is a diagram showing an example of the detail in the periphery of an ion source in FIG. 1.

FIG. 2 shows an example of the detail in the periphery of the ion source 2. The ion source 2 comprises: a plasma chamber 20 into which an ion source gas 50 is introduced, and which is used for internally producing a plasma 22; one or more (in this example, plural) filaments 24 constituting an ionizing member (strictly, a part of the member) for ionizing the ion source gas 50 in the plasma chamber 20 by means of electron impact to produce the plasma 22; and an extraction electrode system 30 which is disposed in the vicinity of an opening portion of the plasma chamber 20, and which accelerates the ion beam 4 by the function of an electric field due to the plasma 22 to extract the ion beam.

The plural filaments 24 are disposed in the plasma chamber 20 to be juxtaposed in the direction of the width W of the ion beam 4. To each of the filaments 24, a filament power source 26 which heats the filament is connected. A DC arc power source 28 is connected between one end (in this example, a positive end) of each of the filaments 24 and the plasma chamber 20 while setting the latter as the positive side. The plasma chamber 20 functions also as the anode. An arc discharge is produced between each of the filaments 24 and the plasma chamber 20, and the ion source gas 50 is ionized by means of impact of electrons which are generated in the discharge, whereby the plasma 22 which is lengthwise distributed in the direction of the width W of the ion beam 4 can be uniformly produced in the plasma chamber 20. In this example, the filaments 24, the filament power source 26, and the arc power source 28 constitute the ionizing member. As described above, the ion source 2 is an electron impact type ion source.

In the periphery of the plasma chamber 20, i.e., in this example, in the periphery of the side faces and the back faces of the plasma chamber 20, plural (in this example, many) magnets 40 for forming a cusp magnetic field (strictly, a multi-cusp magnetic field, also called multi-pole magnetic field) are arranged in the vicinity of the inner wall of the plasma chamber 20. In this example, the magnets 40 are permanent magnets, or alternatively may be electromagnets. The ion source 2 is called a bucket type ion source or the like as described above.

The extraction electrode system 30 has one or more electrodes. In this example, the system has a plasma electrode 31, an extraction electrode 32, a suppression electrode 33, and a ground electrode 34 which are arranged from the side that is closest to the plasma to the downstream side. In this example, the electrodes 31 to 34 have many ion extraction holes at mutually corresponding positions.

An insulator 36 which serves as an insulating member for electrically insulating the plasma electrode 31 from the plasma chamber 20 is disposed between the plasma electrode and the plasma chamber. For example, an insulator 38 electrically insulates the electrodes 31 to 34 from one another.

Simply speaking, the plasma electrode 31 is an electrode which defines the energy of the ion beam 4 to be extracted. A bias voltage $V_B$ which is positive or negative with respect to the plasma chamber 20 is applied to the plasma electrode 31 via a bias circuit 64 which will be described later. A high voltage (acceleration voltage) which is positive with reference to the ground potential is applied from a DC acceleration power source 42 to the plasma chamber 20. The extraction electrode 32 is an electrode which produces a potential difference with respect to the plasma electrode 31, and which extracts the ion beam 4 from the plasma 22 by means of an electric field due to the potential difference. A voltage (extraction voltage) which is negative with reference to the potential of the plasma chamber 20 is applied from a DC extraction power source 44 to the extraction electrode. The suppression electrode 33 is an electrode which suppresses a reverse flow of electrons from the downstream side, and to which a voltage (suppression voltage) that is negative with reference to the ground potential is applied from a DC suppression power source 46. The ground electrode 34 is grounded.

The ion source gas 50 containing boron trifluoride ($BF_3$) can be supplied from a gas supply source 48 constituting a gas supplying unit, into the plasma chamber 20.

Figure 3:
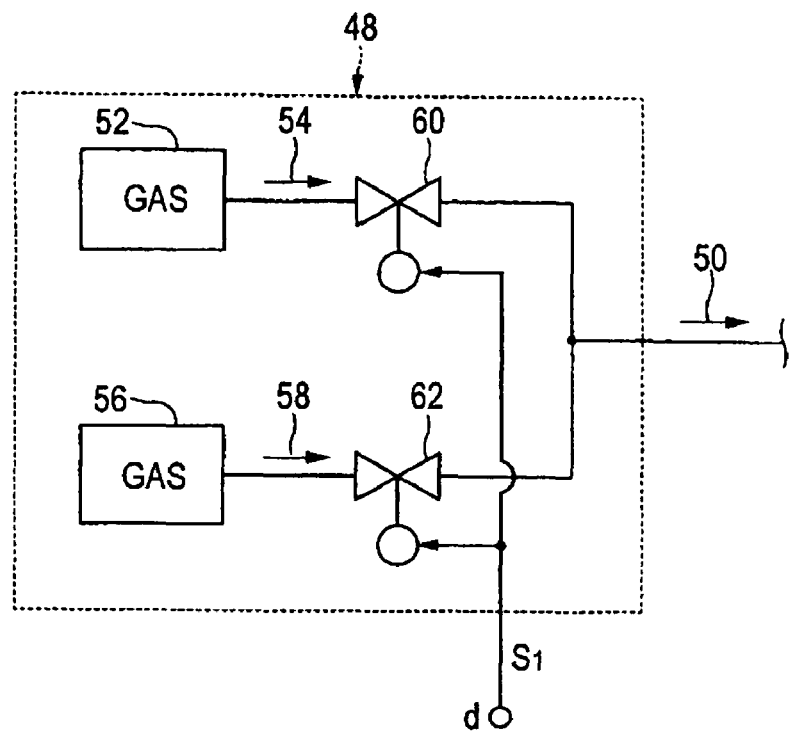
FIG. 3 is a diagram showing an example of a gas supply source in FIG. 2.

Alternatively, as the gas supply source 48, a configuration which can switchingly supply either of the ion source gas 50 containing boron trifluoride, and the ion source gas 50 containing phosphine ($PH_3$), into the plasma chamber 20 may be employed. FIG. 3 shows an example of the thus configured gas supply source 48.

The gas supply source 48 shown in FIG. 3 can switch over valves 60, 62 to supply either of a gas 54 containing boron trifluoride from a gas source 52, and a gas 58 containing phosphine from a gas source 56, as the ion source gas 50 into the plasma chamber 20. The switching of the valves 60, 62, or that of the ion source gas 50 may be manually performed. Alternatively, it is preferable to configure the valves 60, 62 as control valves and control the valves on the basis of a control signal $S_1$ supplied from a controlling device 80 (see FIG. 1, the same will apply hereinafter) as in this example.

Figure 4:
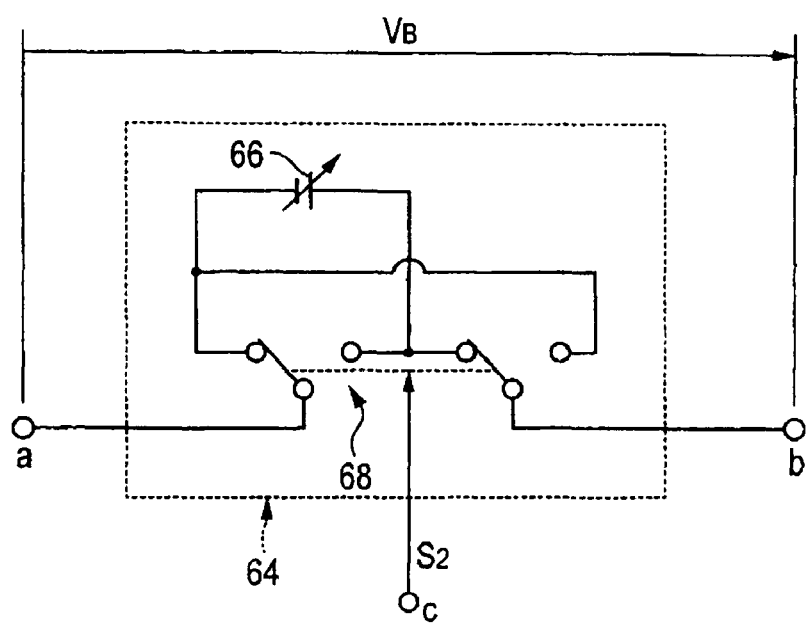
FIG. 4 is a diagram showing another example of a bias circuit in FIG. 2.
Figure 5:
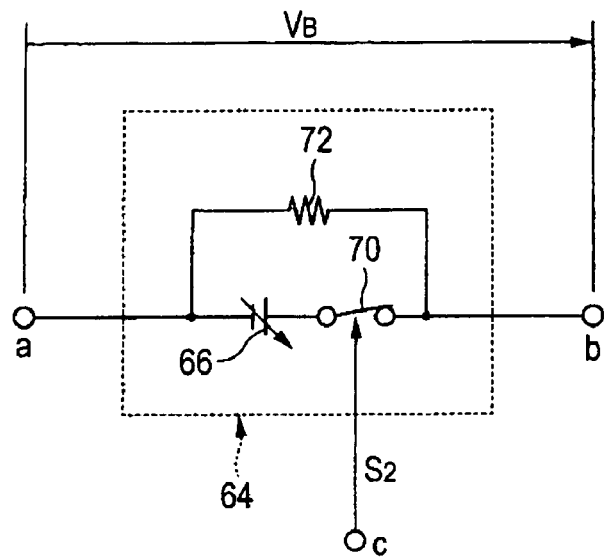
FIG. 5 is a diagram showing a further example of the bias circuit in FIG. 2.

The points a to d in FIG. 2 correspond to the points a to d in FIGS. 3 to 5, respectively.

Usually, boron trifluoride is used at a concentration of 100% or in the vicinity thereof. Also in such a case, in the specification, the gas is generically referred to as a gas containing boron trifluoride. Usually, phosphine is used while being adequately diluted with hydrogen or helium. In this case, literally, the used gas is a gas containing phosphine.

Referring again FIG. 2, the bias circuit 64 is connected between the plasma chamber 20 and the plasma electrode 31. The bias circuit constitutes a biasing unit for controlling the bias voltage $V_B$ which is the potential of the plasma electrode 31 with respect to the plasma chamber 20 when the ion beam 4 is extracted (in other words, the potential of the plasma electrode 31 with reference to the plasma chamber 20). In the bias circuit 64, the bias voltage $V_B$ may be set to be positive. Alternatively, a configuration where the bias voltage $V_B$ can be switched between positive and negative voltages may be employed as the bias circuit 64.

In the case where the bias voltage $V_B$ is set to be positive, as shown in FIG. 2, the bias circuit 64 may be configured by a DC bias power source 66 which applies the bias voltage $V_B$ that is positive with respect to the plasma chamber 20, to the plasma electrode 31. Preferably, the bias power source 66 may be configured so that the output voltage is variable. This is similarly applicable also to a bias power source 66 of another example which will be described later. The bias circuit 64 is used when the ion source gas 50 containing boron trifluoride is to be supplied into the plasma chamber 20 and the ion beam 4 is to be extracted by using the ion source gas 50.

For example, the bias circuit 64 in which the bias voltage $V_B$ is switchable between a positive voltage and a negative voltage may be a bipolar power source in which the output voltage is switchable between a positive voltage and a negative voltage. In this case, the switching (in other words, inverting, and the same will apply hereinafter) of the polarity of the output voltage of the bias power source 66 may be manually performed. Alternatively, it is preferable to perform the switching on the basis of a control signal $S_2$ supplied from the controlling device 80 as in this example.

Alternatively, the bias circuit 64 may be configured as shown in FIG. 4 or 5.

The bias circuit 64 shown in FIG. 4 has: a usual (namely, the output voltage has a single polarity, and the same will apply hereinafter) DC bias power source 66; and two changeover switches 68 which output the output voltage of the power source between the points a, b while inverting the polarity. The switching of the changeover switches 68, i.e., that of the polarity of the bias voltage $V_B$ may be manually performed. Alternatively, it is preferable to perform the switching on the basis of the control signal $S_2$ supplied from the controlling device 80 as in this example.

The bias circuit 64 shown in FIG. 5 has: a usual DC bias power source 66; a switch 70 which is connected in series to the power source; and a resistor 72 which is connected in parallel to the series circuit of the two components. The resistor 72 may have a high resistance (e.g., 1 kΩ to 1 MΩ) which sets the plasma electrode 31 to a floating potential. When the switch 70 is turned ON, the bias voltage $V_B$ can be set to be positive by the output voltage from the bias power source 66. When the switch 70 is turned OFF, the plasma electrode 31 is set to the floating potential by the resistor 72, so that the potential of the plasma electrode 31 can be set to be negative by the function of the above-mentioned electron incidence in the ion beam extraction, to cause the bias voltage $V_B$ to be negative. The ON/OFF operations of the switch 70, i.e., the switching of the polarity of the bias voltage $V_B$ may be manually performed. Alternatively, it is preferable to perform the switching on the basis of the control signal $S_2$ supplied from the controlling device 80 as in this example.

The controlling device 80 has a function of controlling the gas supply source 48 and the bias circuit 64 by using the control signals $S_1$, $S_2$, and, when the ion source gas 50 containing boron trifluoride is to be supplied into the plasma chamber 20, setting the bias voltage $V_B$ to be positive, and, when the ion source gas 50 containing phosphine is to be supplied into the plasma chamber 20, setting the bias voltage $V_B$ to be negative.

A first method of operating the ion source 2 will be described. When the ion beam 4 is to be extracted by using the gas containing boron trifluoride as the ion source gas 50, the bias voltage $V_B$ is set to be positive. According to the configuration, the ratio of $B^+$ in the ion beam 4 can be increased as compared with the case where the bias voltage $V_B$ is negative or 0 V. Namely, it is possible to efficiently extract $B^+$.

Figure 6:
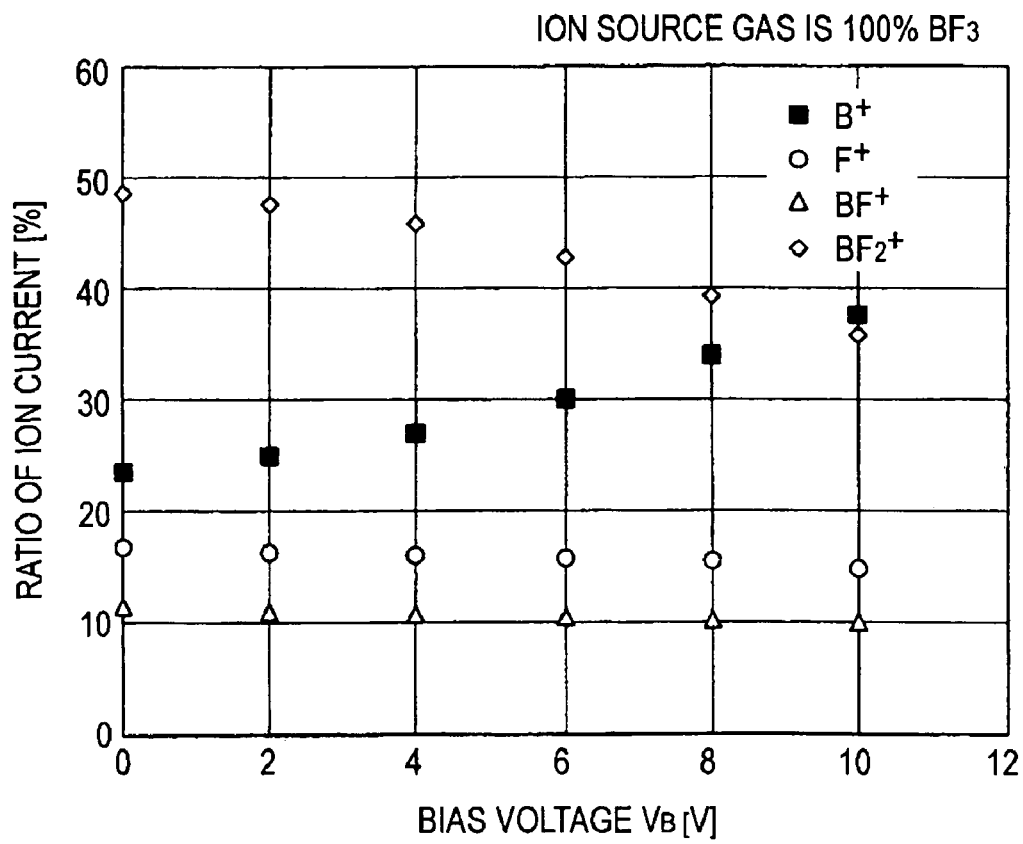
FIG. 6 is a view showing an example of results of measurements of ratios of various ion currents in an ion beam in the case where 100% $BF_3$ is used as an ion source gas and a bias voltage is changed.

FIG. 6 shows an example of results of measurements of ratios of various ion currents in the ion beam 4 in the case where 100% $BF_3$ (i.e., $BF_3$ of a concentration of 100%) is used as the ion source gas 50 and the bias voltage $V_B$ is changed. In this example, $B^+$ was extracted by an ion current of 250 to 270 μA/cm under the following conditions. The flow rate of the ion source gas 50 is 6 ccm, the arc voltage from the arc power source 28 is 80 V, the arc current is 22 A, the acceleration voltage from the acceleration power source 42 is 50 kV, the extraction voltage from the extraction power source 44 is 7 to 12 kV, and the suppression voltage from the suppression power source 46 is 0.5 kV.

As seen from FIG. 6, as the bias voltage $V_B$ is set to be positive and its absolute value is made larger, the ratio of $B^+$ is relatively larger, and the ratios of other ions are relatively smaller. In other words, the ratios of ion kinds such as $B^+$ contained in the ion beam 4 can be controlled by the level of the positive bias voltage $V_B$. Although not shown in FIG. 6, when the bias voltage $V_B$ is set to be negative, the ratio of $B^+$ is further reduced, and that of $BF_2^+$ is further increased.

The principle of achieving such a result has not yet been correctly elucidated. However, it may be contemplated that, when the bias voltage $V_B$ is set to be positive and the positive voltage is made higher, the plasma 22 further approaches the plasma electrode 31 as compared with the case where the bias voltage is set to be negative, and the possibility that $BF_2^+$, $BF^+$, and the like having a large cross-section area are neutralized in the vicinity of the plasma electrode 31 by recombination with electrons is larger than the case of $B^+$.

From FIG. 6, it can be said that, in order to increase the ratio of $B^+$ in the ion beam 4, the bias voltage $V_B$ is preferably set in an approximate range of $0<V_B \leq 10$ [V]. The upper limit of the bias voltage $V_B$ may be made slightly higher than 10 V, or for example set to about 15 V.

As described above, the ratio of $B^+$ in the ion beam 4 can be increased, whereby the following effect is attained. In the case where $B^+$ is used as the desired ions (for example, dopant ions for ion implantation on the substrate 10), the ratio in which undesired ions other than the dopant ions are accelerated can be decreased. Therefore, the capacity of the acceleration power source for accelerating the ion beam 4 can be reduced. In the example of FIG. 2, the acceleration power source is the acceleration power source 42. In the case where a subsequent-stage accelerator is disposed on the downstream side of the ion source 2, or, for example, between the mass separating magnet 6 and the separation slit 8 shown in FIG. 1, also an acceleration power source for the accelerator corresponds to the acceleration power source (the same will apply hereinafter).

In the case where the mass separating unit (specifically, the mass separating magnet 6 and the separation slit 8) is disposed on the downstream side of the ion source 2 such as the case of the embodiment shown FIG. 1, the problems of an out-gas which is generated by impinging of the undesired ions against the wall face of the mass separating magnet 6 or the separation slit 8, and contamination of the substrate 10 by a metal substance emitted by the impingement (i.e., metal contamination) can be reduced.

A second method of operating the ion source 2 will be described. When the ion beam 4 is to be extracted by using the gas containing boron trifluoride as the ion source gas 50, the bias voltage $V_B$ is set to be positive, and, when the ion beam 4 is to be extracted by using the gas containing phosphine as the ion source gas 50, the bias voltage $V_B$ is set to be negative. In the case where the bias voltage $V_B$ is switchingly output in this way, when the gas containing boron trifluoride is used as the ion source gas 50, the ratio of $B^+$ in the ion beam 4 can be increased and $B^+$ can be efficiently extracted, and, when the gas containing phosphine is used, the ratio of $PH_x^+$ in the ion beam 4 can be increased and $PH_x^+$ can be efficiently extracted.

Figure 7:
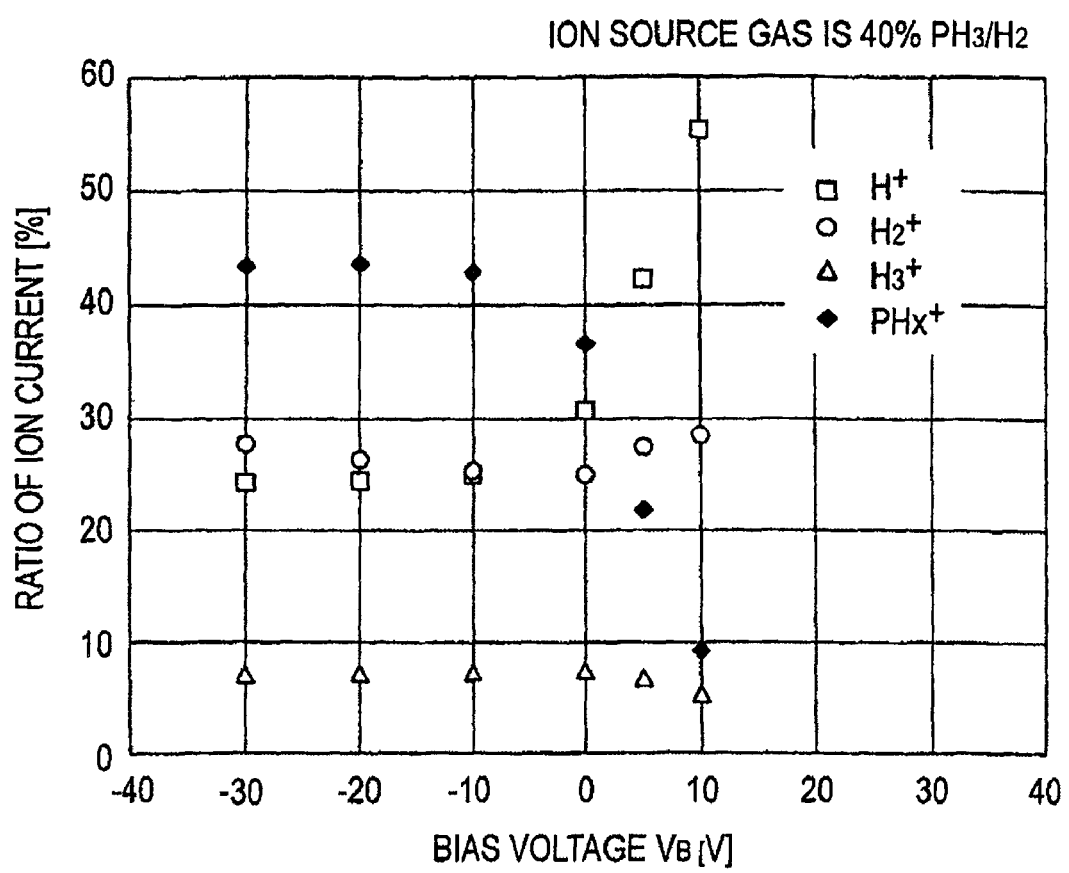
FIG. 7 is a view showing an example of results of measurements of ratios of various ion currents in the ion beam in the case where 40% $PH_3/H_2$ is used as the ion source gas and the bias voltage is changed.

The results of measurements in the case where 100% $BF_3$ is used as the ion source gas 50 are as described above with reference to FIG. 6. FIG. 7 shows an example of results of measurements of ratios of various ion currents in the ion beam 4 in the case where 40% $PH_3/H_2$ (i.e., $PH_3$ of a concentration of 40% diluted with hydrogen) is used as the ion source gas 50 and the bias voltage $V_B$ is changed. In the figure, $PH_x^+$ indicates a total of $P^+$, $PH^+$, $PH_2^+$, and $PH_3^+$ which are ions of a mass number of 31 to 34 [amu].

FIG. 7 shows the example in which $PH^+$ is extracted by an ion current of 375 to 510 μA/cm under the following conditions. The flow rate of the ion source gas 50 is 14 ccm, the arc voltage from the arc power source 28 is 40 V, the arc current is 22 A, the acceleration voltage from the acceleration power source 42 is 65 kV, the extraction voltage from the extraction power source 44 is 7 kV, and the suppression voltage from the suppression power source 46 is 0.5 kV.

As seen from FIG. 7, as the bias voltage $V_B$ is set to be negative and its absolute value is made larger, the ratio of $PH_x^+$ is relatively larger, and the ratios of other ions are relatively smaller. In other words, the ratios of ion kinds such as $PH_x^+$ contained in the ion beam 4 can be controlled by the level of the negative bias voltage $V_B$. When the bias voltage $V_B$ is set to be 0 V or positive, the ratio of $PH_x^+$ is further reduced.

From FIG. 7, it can be said that, in order to increase the ratio of $PH_x^+$ in the ion beam 4, the bias voltage $V_B$ is preferably set to be negative, and specifically it is more preferable in this example to set the bias voltage to be in an approximate range of $-30 \leq V_B < 0$ [V], particularly in a range of $-30 \leq V_B < -10$ [V]. In the case where the bias power source 66 constituting the bias circuit 64 is configured by a bipolar power source as described above, when the above-mentioned ranges are summed up, the variable range of the output may be, for example, $-30$ V to $+15$V.

As described above, according to the second operating method, in the case where $B^+$ and $PH_x^+$ are switchingly used as desired ions (for example, dopant ions for ion implantation on the substrate 10), in both the ion kinds, the capacity of an acceleration power source can be reduced in the same manner as the first operating method. Furthermore, the problems of an out-gas and metal contamination in the case where a mass separating unit is disposed can be reduced.

The ion implanting apparatus which is shown in FIGS. 1 and 2, which, as the gas supply source 48, comprises a gas supply source for supplying the ion source gas 50 containing boron trifluoride into the plasma chamber 20, and which, as the bias circuit 64, comprises a circuit for setting the bias voltage $V_B$ to be positive in the case where the ion beam 4 is extracted by using the ion source gas 50 containing boron trifluoride is referred to as a first ion implanting apparatus. As apparent from the descriptions of the first and second methods of operating the ion source 2 and the like, according to the first ion implanting apparatus, the ion beam 4 including boron-containing ions can be extracted from the ion source 2 by using the ion source gas 50 containing boron trifluoride, and the bias voltage $V_B$ can be made positive so that the ratio of $B^+$ in the ion beam 4 can be increased. Namely, $B^+$ can be efficiently extracted.

Consequently, the following effects can be attained. When $B^+$ is used as dopant ions for ion implantation on the substrate 10, the ratio in which undesired ions other than the desired ones are accelerated can be reduced. Therefore, the capacity of the acceleration power source for accelerating the ion beam 4 can be reduced. In the case where a mass separating unit is disposed between the ion source 2 and the holding portion 12 for the substrate 10, as described above, it is possible to reduce the problems of an out-gas which is generated by impinging of the undesired ions in the mass separating unit, against a wall face or the like, and metal-contamination.

In the case where the mass separating unit is disposed as in the embodiment shown in FIG. 1, the mass separating function can suppress undesired ions other than dopant ions from being implanted into the substrate 10 (this is applicable also in a second ion implanting apparatus) which will be described below.

The ion implanting apparatus which is shown in FIGS. 1 and 2, which, as the gas supply source 48, comprises a gas supply source for switchingly supplying the ion source gas 50 containing boron trifluoride, and the ion source gas 50 containing phosphine into the plasma chamber 20, which, as the bias circuit 64, comprises a circuit for, when the ion beam 4 is to be extracted from the ion source 2, switching the bias voltage $V_B$ between a positive voltage and a negative voltage, and which comprises the controlling device 80 for controlling the gas supply source 48 and the bias circuit 64, and, when the ion source gas 50 containing boron trifluoride is to be supplied into the plasma chamber 20, setting the bias voltage $V_B$ to be positive, and, when the ion source gas 50 containing phosphine is to be supplied into the plasma chamber 20, setting the bias voltage $V_B$ to be negative is referred to as the second ion implanting apparatus. As apparent from the descriptions of the first and second methods of operating the ion source 2 and the like, according to the second first ion implanting apparatus, the ion source gas 50 is switched to either of a gas containing boron trifluoride and that containing phosphine, so that the gas containing boron trifluoride and that containing phosphine can be switchingly extracted from the single ion source 2, and the bias voltage $V_B$ is switched as described above, so that, when the ion source gas 50 containing boron trifluoride is used, the ratio of $B^+$ in the ion beam 4 can be increased and $B^+$ can be efficiently extracted, and, when the ion source gas 50 containing phosphine is used, the ratio of $PH_x^+$ in the ion beam 4 can be increased and $PH_x^+$ can be efficiently extracted.

Consequently, the following effects can be attained. When $B^+$ and $PH_x^+$ are switchingly used as dopant ions for ion implantation on the substrate 10, in both the ion kinds, the capacity of the acceleration power source can be reduced in the same manner as the first ion implanting apparatus. In the case where a mass separating unit is disposed, it is possible to reduce the problems of an out-gas and metal contamination.

What is claimed is:

1. A method of operating an ion source which comprises a plasma chamber into which an ion source gas is introduced, and which is used for internally producing a plasma, an extraction electrode system which is disposed in a vicinity of an opening portion of said plasma chamber, which extracts an ion beam from the plasma, and which has one or more electrodes, an insulating member for electrically insulating a plasma electrode from said plasma chamber, said plasma electrode being an electrode which is closest to the plasma among said electrodes constituting said extraction electrode system, and a plurality of magnets form a cusp magnetic field in a vicinity of an inner wall of said plasma chamber and are placed only outside of said plasma chamber in opposition to an outer wall of said plasma chamber, said method comprising:

supplying a control signal configured to switchingly and selectively supply either boron trifluoride ($BF_3$) or phosphine ($PH_3$) as the ion source gas into the plasma chamber, when the ion beam is to be extracted by using a gas containing boron trifluoride ($BF_3$) as the ion source gas, setting a bias voltage of said plasma electrode with respect to said plasma chamber to be positive so as to increase a ratio of $B^+$ in the ion beam with respect to all other ions present in the ion beam, and when the ion beam is to be extracted by using a gas containing phosphine ($PH_3$) as the ion source gas, setting the bias voltage of said plasma electrode with respect to said plasma chamber to be negative so as to increase a ratio of $PHx^+$ in the ion beam with respect to all other ions present in the ion beam, wherein x is an integer and $0 \leq x \leq 3$, wherein when the gas containing phosphine ($PH_3$) is used as the ion source gas, the bias voltage is set in a range of $-30[V] \leq V_B < 0$, where $V_B$ is the bias voltage.

2. A method of operating an ion source according to claim 1, wherein when the gas containing boron trifluoride is used as the ion source gas, the bias voltage is set in a range of $0 < V_B \leq 10[V]$ wherein $V_B$ is the bias voltage.

* * * * *